United States Patent
Dai et al.

(10) Patent No.: US 11,048,840 B2
(45) Date of Patent: Jun. 29, 2021

(54) METHOD FOR ELIMINATING FALSE PATHS OF A CIRCUIT UNIT TO BE IMPLEMENTED USING A SYSTEM

(71) Applicant: Taiwan Semiconductor Manufacturing Company Limited, Hsinchu (TW)

(72) Inventors: Chun-Jiun Dai, Taichung (TW); Hung-Jen Liao, Hsinchu (TW); Wei-Min Chan, New Taipei (TW); Yen-Huei Chen, Hsinchu County (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 50 days.

(21) Appl. No.: 16/383,735

(22) Filed: Apr. 15, 2019

(65) Prior Publication Data

US 2019/0236241 A1    Aug. 1, 2019

Related U.S. Application Data (62) Division of application No. 15/367,312, filed on Dec. 2, 2016, now Pat. No. 10,275,561.

(60) Provisional application No. 62/342,237, filed on May 27, 2016.

(51) Int. Cl.
*G06F 30/00* (2020.01)
*G06F 30/33* (2020.01)
*G06F 30/337* (2020.01)
*G06F 30/3312* (2020.01)
*G06F 30/398* (2020.01)
*G06F 30/30* (2020.01)
*G06F 30/394* (2020.01)

(52) U.S. Cl.
CPC .............. *G06F 30/33* (2020.01); *G06F 30/30* (2020.01); *G06F 30/337* (2020.01); *G06F 30/3312* (2020.01); *G06F 30/394* (2020.01); *G06F 30/398* (2020.01)

(58) Field of Classification Search
CPC .... G06F 30/33; G06F 30/3312; G06F 30/337; G06F 30/394; G06F 30/398; G06F 30/30
See application file for complete search history.

(56) References Cited

U.S. PATENT DOCUMENTS

| 5,210,699 | A | | 5/1993 | Harrington |
| 5,675,728 | A | | 10/1997 | Kunda et al. |
| 5,946,475 | A | * | 8/1999 | Burks ............... G06F 30/33 716/108 |

(Continued)

FOREIGN PATENT DOCUMENTS

EP    1843267 A1 * 10/2007    ......... G06F 30/3312

*Primary Examiner* — Naum Levin
(74) *Attorney, Agent, or Firm* — Jones Day (57) ABSTRACT

A system includes a net-identifying module and a false path-eliminating module. The net-identifying module is configured to receive first and second electronic lists associated with a circuit unit, to identify a net of the circuit unit based on the first electronic list, and to provide a net information output that includes information associated with the net. The false path-eliminating module is coupled to the net-identifying module and is configured to select, in the second electronic list, a path of the circuit unit that does not traverse through the net and provide a path information output that includes information associated with the path.

20 Claims, 8 Drawing Sheets

(56) References Cited

U.S. PATENT DOCUMENTS

| | | | |
|---|---|---|---|
| 6,047,247 A * | 4/2000 | Iwanishi | G06F 11/008 702/117 |
| 6,163,877 A | 12/2000 | Gupta | |
| 6,292,924 B1 | 9/2001 | Pavisic et al. | |
| 6,473,881 B1 * | 10/2002 | Lehner | G06F 30/39 716/107 |
| 6,543,031 B1 | 4/2003 | Kamdar et al. | |
| 6,550,041 B1 * | 4/2003 | McBride | G06F 30/33 716/112 |
| 6,557,149 B2 * | 4/2003 | Morrise | G06F 30/33 716/129 |
| 6,591,402 B1 | 7/2003 | Chandra et al. | |
| 6,714,902 B1 | 3/2004 | Chao et al. | |
| 6,718,529 B1 | 4/2004 | Iwanishi | |
| 6,735,751 B2 * | 5/2004 | Furusawa | G06F 30/33 716/104 |
| 6,820,243 B1 * | 11/2004 | Shey | G06F 30/367 716/106 |
| 6,895,524 B2 | 5/2005 | Korobkov | |
| 7,000,202 B1 * | 2/2006 | Srinivasan | G06F 30/20 716/108 |
| 7,143,023 B2 * | 11/2006 | Katz | G06F 30/33 703/16 |
| 7,216,318 B1 | 5/2007 | Siarkowski | |
| 7,299,431 B2 | 11/2007 | Teene | |
| 7,299,433 B2 | 11/2007 | Clement et al. | |
| 7,412,678 B2 | 8/2008 | Lahner et al. | |
| 7,441,217 B2 * | 10/2008 | Higuchi | G06F 30/3312 716/100 |
| 7,555,689 B2 | 6/2009 | Goswami et al. | |
| 7,590,953 B2 * | 9/2009 | Chang | G06F 30/33 716/113 |
| 7,644,380 B1 * | 1/2010 | Pandey | G06F 30/20 716/136 |
| 7,650,581 B2 * | 1/2010 | Rahim | G06F 30/3312 716/113 |
| 7,937,678 B2 | 5/2011 | Lippmann et al. | |
| 8,010,920 B2 * | 8/2011 | Bartolotti | G06F 30/327 716/106 |
| 8,957,398 B2 | 2/2015 | Andreev et al. | |
| 10,013,296 B2 * | 7/2018 | El-Maleh | G01R 31/3177 |
| 2002/0038446 A1 | 3/2002 | Ioudovski | |
| 2006/0200787 A1 | 9/2006 | Teene | |
| 2006/0259885 A1 * | 11/2006 | Mortensen | G06F 30/3323 716/105 |
| 2006/0265680 A1 * | 11/2006 | Scheffer | G06F 30/398 716/103 |
| 2019/0018917 A1 * | 1/2019 | Dai | G06F 30/3312 |

\* cited by examiner

METHOD FOR ELIMINATING FALSE PATHS OF A CIRCUIT UNIT TO BE IMPLEMENTED USING A SYSTEM

CROSS-REFERENCE TO RELATED APPLICATION

This application is a divisional application of U.S. patent application Ser. No. 15/367,312, filed on Dec. 2, 2016, which claims priority to U.S. Provisional Patent Application No. 62/342,237, filed May 27, 2016, both of which are incorporated herein by reference in their entirety.

BACKGROUND

Circuit analysis is usually performed on a circuit unit using a system. During the circuit analysis, the system employs a list, in the form of an electronic signal, that contains information associated with paths of the circuit unit. The information associated with paths of the circuit unit may include false paths not traversed during an actual operation of the circuit unit and on which the system unnecessarily performs the circuit analysis. It is therefore desirable to eliminate such false paths in the electronic list.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various exemplary methods for eliminating in an electronic list false paths of a circuit unit, in a manner that will be described in detail herein, whereby circuit analysis may be performed only on true paths of the circuit unit. In some embodiments, the methods are program instructions stored in a computer readable storage medium. The present disclosure also provides an exemplary system that performs the methods. In some embodiments, the system includes a controller capable of executing the program instructions.

Figure 1:
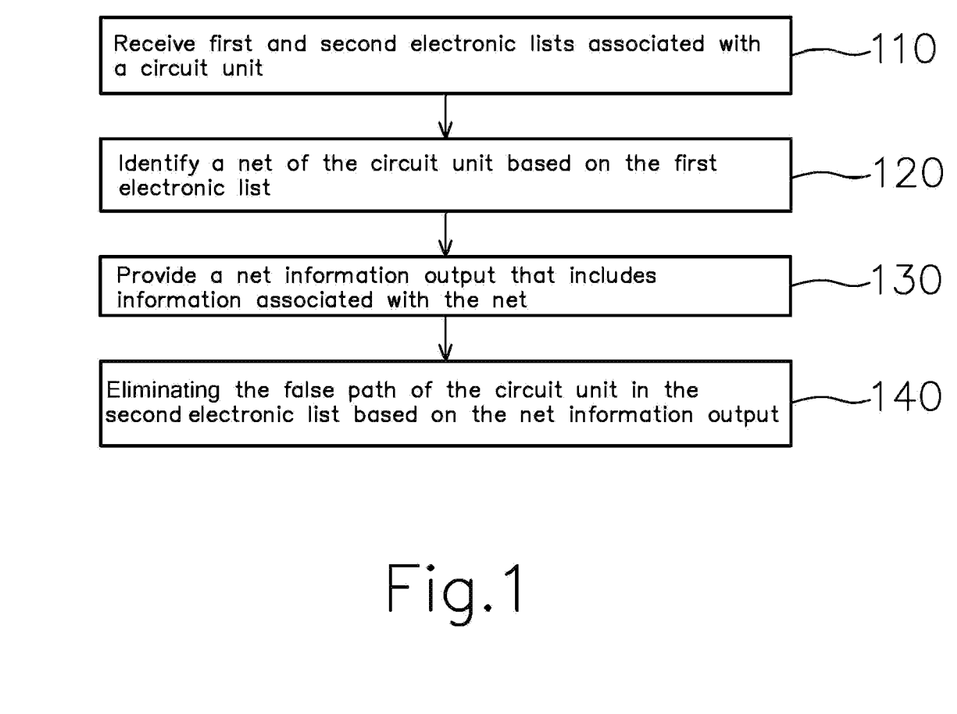
FIG. 1 is a flow chart of an exemplary method for eliminating false paths of a circuit unit according to some embodiments.

FIG. 1 is a flow chart of a method for eliminating false paths of a circuit unit according to some embodiments. The circuit unit includes a pair of circuits, each of which includes a plurality of transistors. The transistors of each of the circuits have channels coupled to each other through source/drain terminals thereof. Therefore, each circuit may be referred to as a common channel group (CCG) circuit. In some embodiments, at least one of the CCG circuits is a NOT gate, an AND gate, a NAND gate, an OR gate, a NOR gate, an XOR gate, an XNOR gate, any logic gate, a combination thereof, and the like. It should be understood that a component that interconnects a pair of CCG circuit is referred to as a net.

In operation 110, first and second electronic lists are received. The first electronic list, such as a net list, contains information associated with connections among the transistors of the CCG circuits. The second electronic list contains information associated with paths that each traverse from a FROM node to a TO node through a THROUGH node of the circuit unit. The information associated with paths include a true path of the circuit unit and in some embodiments a false path of the circuit unit. In such some embodiments, the first electronic list further contains information associated with a false-path net, i.e., a net through which the false path, not the true path, traverses. In operation 120, a false-path net of the circuit unit is identified based on the first electronic list received in operation 110. In operation 130, a net information output that includes information associated with the false-path net identified in operation 120 is provided. In some embodiments, the information associated with the false-path net include modified THROUGH nodes of the circuit unit connected to each other via the false-path net. In operation 140, the false path is eliminated in the second electronic list received in operation 110 based on the net information output provided in operation 130, whereby circuit analysis may be performed only on the true path of the circuit unit.

Figure 2:
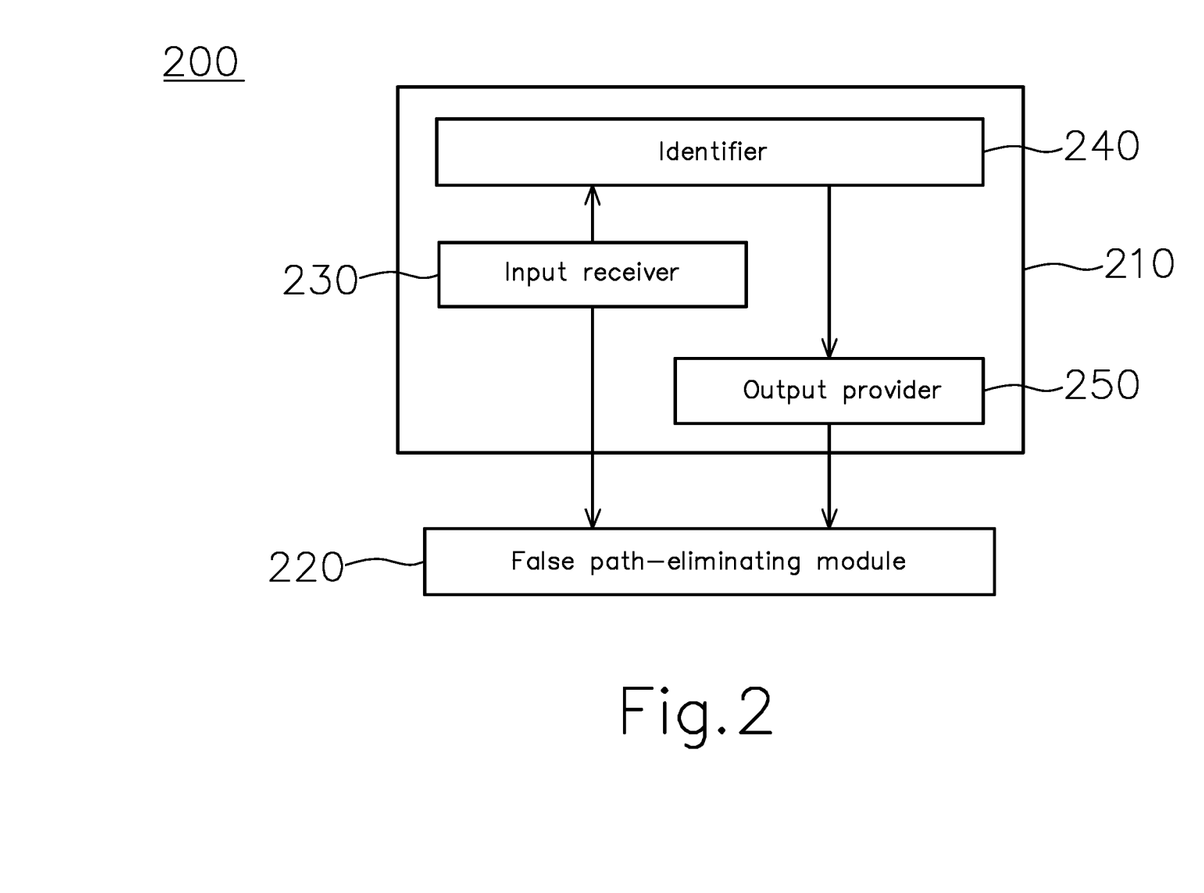
FIG. 2 is a schematic block diagram of an exemplary system according to some embodiments.

FIG. 2 is a schematic block diagram of a system 200 according to some embodiments. The system 200 includes a net-identifying module 210 and a false path-eliminating module 220. In this exemplary embodiment, the net-identifying module 210 includes an input receiver 230, an identifier 240, and an output provider 250. The input receiver 230 is configured to receive a first electronic list, such as a net list, that contains information associated with connections among transistors of a circuit unit. The circuit unit includes a pair of CCG circuits, at least one of which is a NOT gate, an AND gate, a NAND gate, an OR gate, a NOR gate, an XOR gate, an XNOR gate, any logic gate, a combination thereof, and the like.

The identifier 240 is connected to the input receiver 230 and is configured to identify a false-path net of the circuit unit based on the first electronic list received by the input receiver 230. In this exemplary embodiment, the identifier 240 is further configured to replace parallel transistors of the circuit unit with a single transistor, to compare the numbers of source/drain terminals of the circuit unit connected to a THROUGH node of the circuit unit prior to and after replacing the parallel transistors with the single transistor, and to identify a net connected to the THROUGH node as the false-path net when the result of comparison indicates that numbers of source/drain terminals are not the same.

The output provider 250 is connected to the identifier 240 and is configured to provide a net information output that includes information associated with the false-path net identified by the identifier 240. The information associated with the false-path net includes modified THROUGH nodes of the circuit unit connected to each other via the false-path net. The input receiver 230 is further configured to receive a second electronic list that contains information associated with paths that each traverse from a FROM node to a TO node through a THROUGH node of the circuit unit. The information associated with paths includes a true path of the circuit unit and in some embodiments a false path of the circuit unit.

The false path-eliminating module 220 is connected to the input receiver 230 and the output provider 250 of the net-identifying module 210 and is configured to eliminate the false path in the second electronic list received by the input receiver 230 based on the net information output provided by the output provider 250, whereby circuit analysis may be performed only on the true path of the circuit unit.

Figure 3:
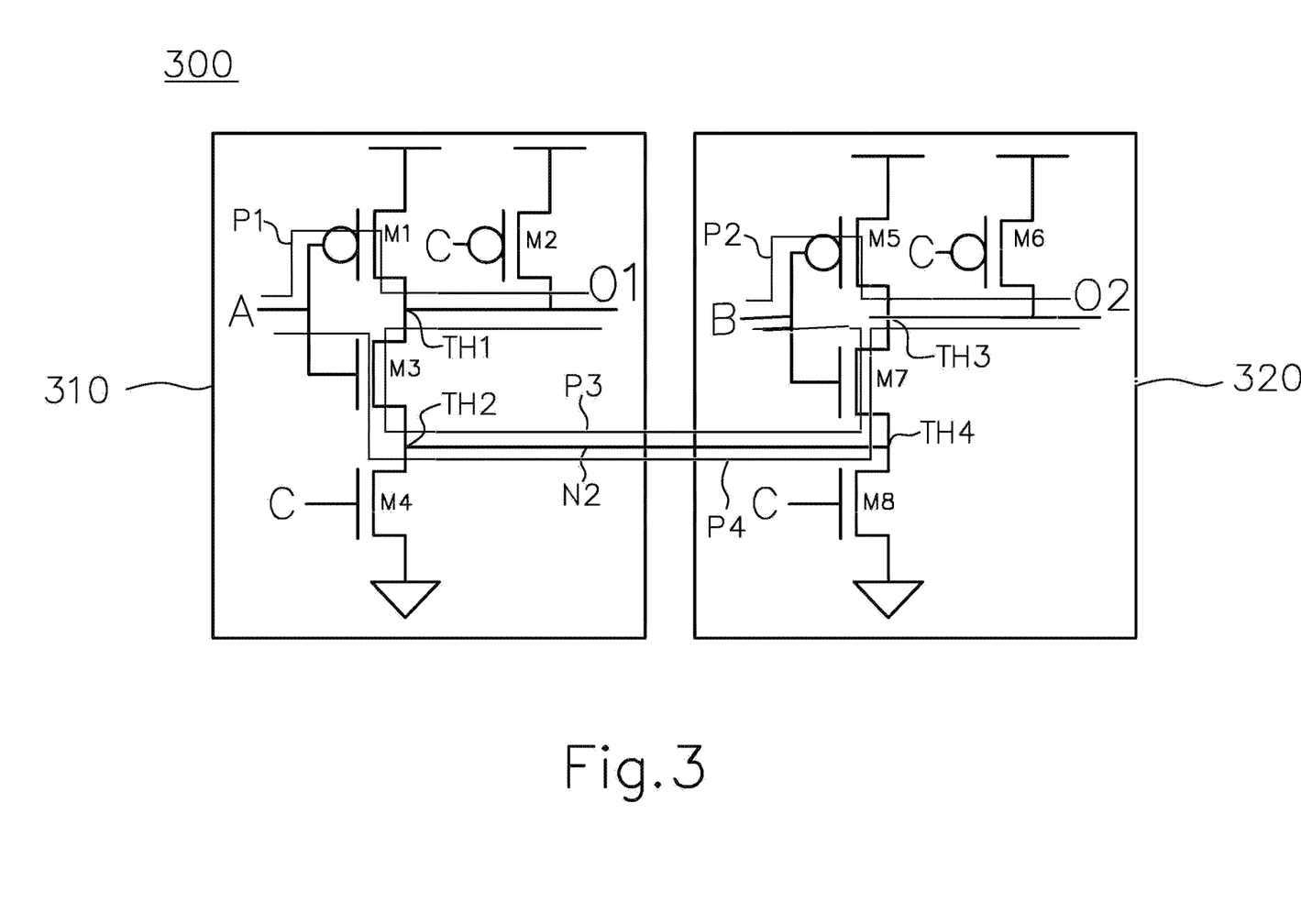
FIG. 3 is a schematic circuit diagram of an exemplary circuit unit according to some embodiments.

FIG. 3 is a schematic circuit diagram of a circuit unit 300 according to some embodiments. The circuit unit 300 includes CCG circuits 310, 320, FROM nodes (A, B, C), TO nodes (O1, O2), and THROUGH nodes (TH1, TH2, TH3, TH4). In this exemplary embodiment, each of the CCG circuits 310, 320 is a NAND gate. As illustrated in FIG. 3, the NAND gate 310 includes transistors (M1, M2, M3, M4), each of which has first and second source/drain terminals and a gate terminal. Likewise, the NAND gate 320 includes transistors (M5, M6, M7, M8), each of which has first and second source/drain terminals and a gate terminal.

An exemplary method for eliminating false paths of the circuit unit 300 with the use of the system 200 according to some embodiments will now be described with further reference to FIG. 1. In operation 110, the input receiver 230 of the net-identifying module 210 receives first and second electronic lists. In this exemplary embodiment, the first electronic list, such as a net list, contains information associated with connections among the transistors (M1, M2, M3, M4, M5, M6, M7, M8) of the circuit unit 300. Such information, as illustrated in FIG. 3, include: the first source/drain terminals of the transistors (M1, M2, M3) connected to the THROUGH node (TH1) and the TO node (O1); the first source/drain terminals of the transistors (M5, M6, M7) connected to the THROUGH node (TH3) and the TO node (O2); the second source/drain terminals of the transistors (M3, M4, M7, M8) connected to the THROUGH nodes (TH2, TH4); the gate terminals of the transistors (M1, M3) connected to the FROM node (A); the gate terminals of the transistors (M5, M7) connected to the FROM node (B); and the gate terminals of the transistors (M2, M4, M6, M8) connected to the FROM node (C).

In this exemplary embodiment, the second electronic list contains information associated with paths of the circuit unit 300. The information associated with paths of the circuit unit 300, as illustrated in FIG. 3, include: a path (P1) that traverses from the FROM node (A) to the TO node (O1) through the THROUGH node (TH1); a path (P2) that traverses from the FROM node (B) to the TO node (O2) through the THROUGH node (TH3); a path (P3) that traverses from the FROM node (A) to the TO node (O2) through the THROUGH nodes (TH2, TH4); and a path (P4) that traverses from the FROM node (B) to the TO node (O1) through the THROUGH nodes (TH2, TH4).

Next, in operation 120, the identifier 240 of the net-identifying module 210 identifies a false-path net of the circuit unit 300 based on the first electronic list. Operation 120 is described below with reference to FIGS. 4-6.

Figure 4:
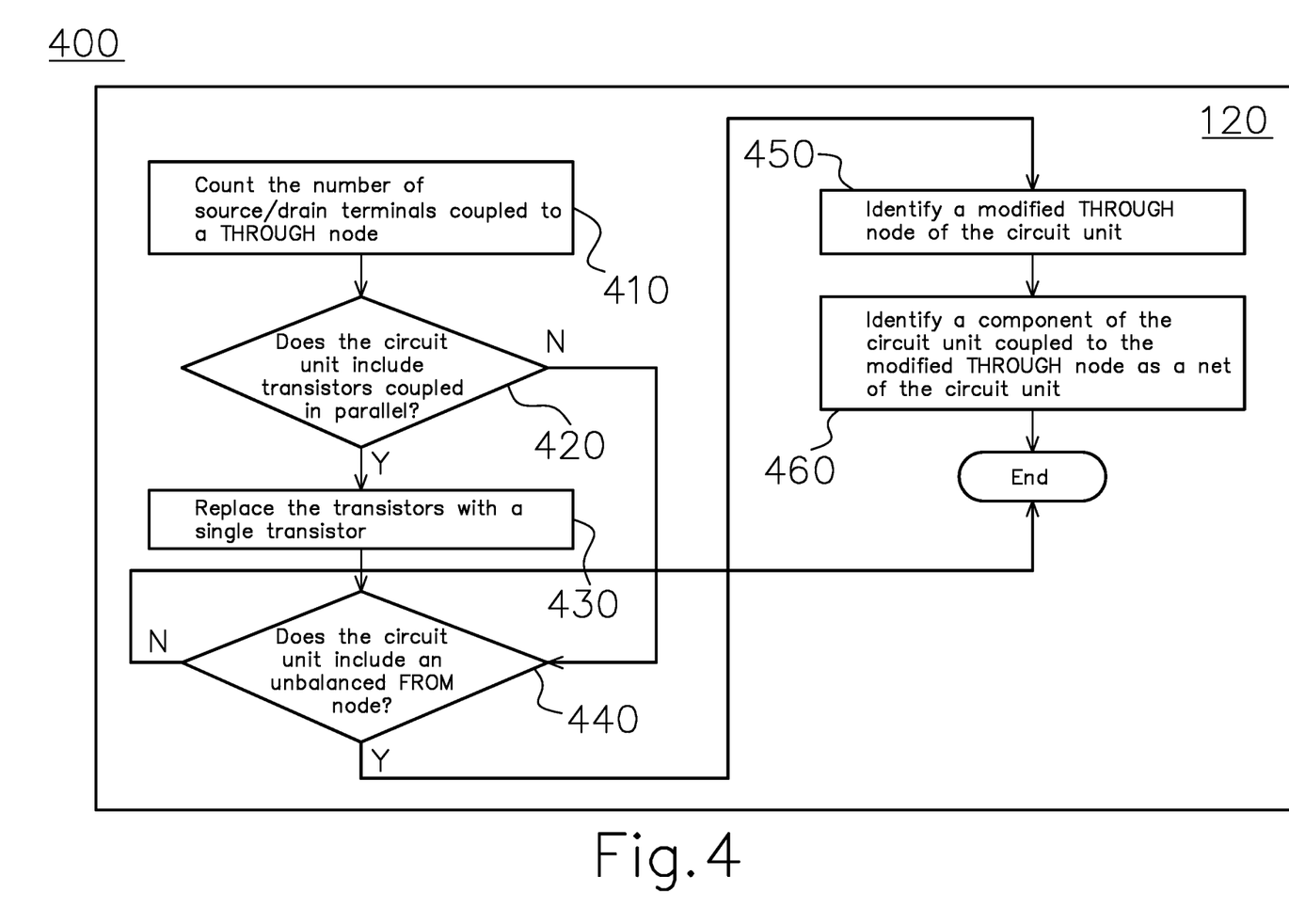
FIG. 4 is a flow chart of an operation of FIG. 1 according to some embodiments.

FIG. 4 is a flow chart of operation 120 of FIG. 1 according to some embodiments. In operation 410, the identifier 240 of the net-identifying module 210 counts the number of source/drain terminals of the circuit unit 300 connected to a THROUGH node of the circuit unit 300. As illustrated in FIG. 3, the THROUGH node (TH1) is connected to the first source/drain terminals of the transistors (M1, M2, M3). The THROUGH nodes (TH2, TH4) are connected to the second source/drain terminals of the transistors (M3, M4, M7, M8). The THROUGH node (TH3) is connected to the first source/drain terminals of the transistors (M5, M6, M7). As such, the numbers of source/drain terminals of the circuit unit 300 connected to the THROUGH nodes (TH1, TH2, TH3, TH4) of the circuit unit 300 obtained by the identifier 240 of the net-identifying module 210 are three, four, three, and four, respectively. In some embodiments, the identifier 240 of the net-identifying module 210 may obtained any number of source/drain terminals connected to a THROUGH node of a circuit unit.

Referring back to FIG. 4, in operation 420, the identifier 240 of the net-identifying module 210 determines whether the circuit unit 300 includes transistors connected in parallel. If it is determined that the circuit unit 300 includes parallel transistors, the flow proceeds to operation 430. Otherwise, i.e., the identifier 240 of the net-identifying module 210 determines that the circuit unit 300 does not include parallel transistors, the flow proceeds to operation 440.

In this exemplary embodiment, operation 420 includes identifying which of the transistors of the circuit unit 300 are connected in parallel. As illustrated in FIG. 3, the first and second source/drain terminals and the gate terminal of the transistor (M4) are connected to the first and second source/drain terminals and the gate terminal of the transistor (M8), respectively. As such, the identifier 240 of the net-identifying module 210 identifies that the transistors (M4, M8) of the circuit unit 300 are parallel transistors and thus determines that the circuit unit 300 includes parallel transistors. Therefore, the flow proceeds to operation 430. In some embodiments, three or more parallel transistors of a circuit unit may be identified by the identifier 240 of the net-identifying module 210.

It should be understood that the transistors (M1, M2), as well as the transistors (M5, M6), of the circuit unit 300 are not connected in parallel because, while the first source/ drain terminals thereof are connected to each other and while the second source/drain terminals thereof are connected to each other, the gate terminals thereof are not. It should also be understood that the transistors (M1, M3), as well as the transistors (M5, M7), of the circuit unit 300 are not connected in parallel because, while the first source/drain terminals thereof are connected to each other and while the gate terminals thereof are connected to each other, the second source/drain terminals thereof are not.

Referring back to FIG. 4, in operation 430, since parallel transistors effectively operate as a single transistor, the identifier 240 of the net-identifying module 210 replaces the parallel transistors, i.e., the transistors (M4, M8), of the circuit unit 300 identified thereby in operation 420 with a single transistor.

Figure 5:
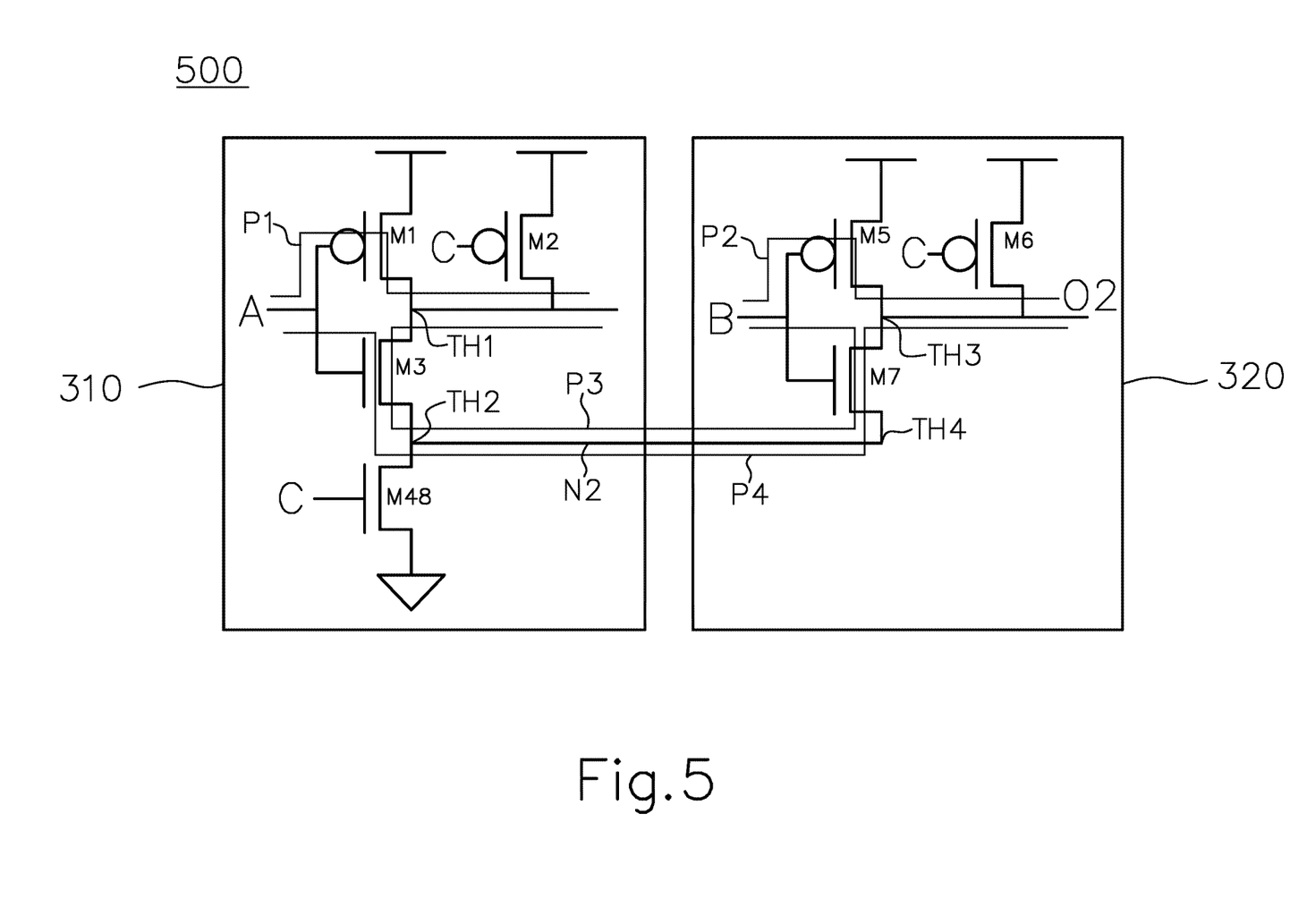
FIG. 5 is a schematic circuit diagram of an exemplary circuit unit according to some embodiments.

FIG. 5 is a schematic circuit diagram of a circuit unit 500 according to some embodiments. As illustrated in FIG. 5, the transistors (M4, M8) of circuit unit 300 are replaced with a transistor (M48), resulting in the circuit unit 500. The transistor (M48) includes a first source/drain terminal connected to a ground, a second source/drain terminal connected to the THROUGH nodes (TH2, TH4), and a gate terminal connected to the FROM node (C).

Referring back to FIG. 4, in operation 440, the identifier 240 of the net-identifying module 210 determines whether the circuit unit 500 includes an unbalanced FROM node. In this exemplary embodiment, the unbalanced FROM node is a FROM node of the circuit unit 500 that has p-type transistors connected thereto the number of which is different from the number of n-type transistors connected thereto. In some embodiments, operation 440 includes (a) counting the numbers of p-type and n-type transistors of the circuit unit 500 connected to a FROM node of the circuit unit 500 and (b) comparing the number of p-type transistors obtained in (a) with the number of n-type transistors obtained in (a).

If it is determined that the circuit unit 500 includes such an unbalanced FROM node, the flow proceed to operation 450. Otherwise, the flow is terminated. As illustrated in FIG. 5, the FROM node (A) has the same number of p-type and n-type transistors connected thereto, i.e., one p-type transistor (M1) and one n-type transistor (M3). The FROM node (B) also has the same number of p-type and n-type transistors connected thereto, i.e., one p-type transistor (M5) and one n-type transistor (M7). The FROM node (C) has different numbers of p-type and n-type transistors connected thereto, i.e., two p-type transistors (M2, M6) and one n-type transistor (M48). As such, the identifier 240 of the net-identifying module 210 determines that the circuit unit 500 includes an unbalanced FROM node. Therefore, the flow proceeds to operation 450.

Figure 6:
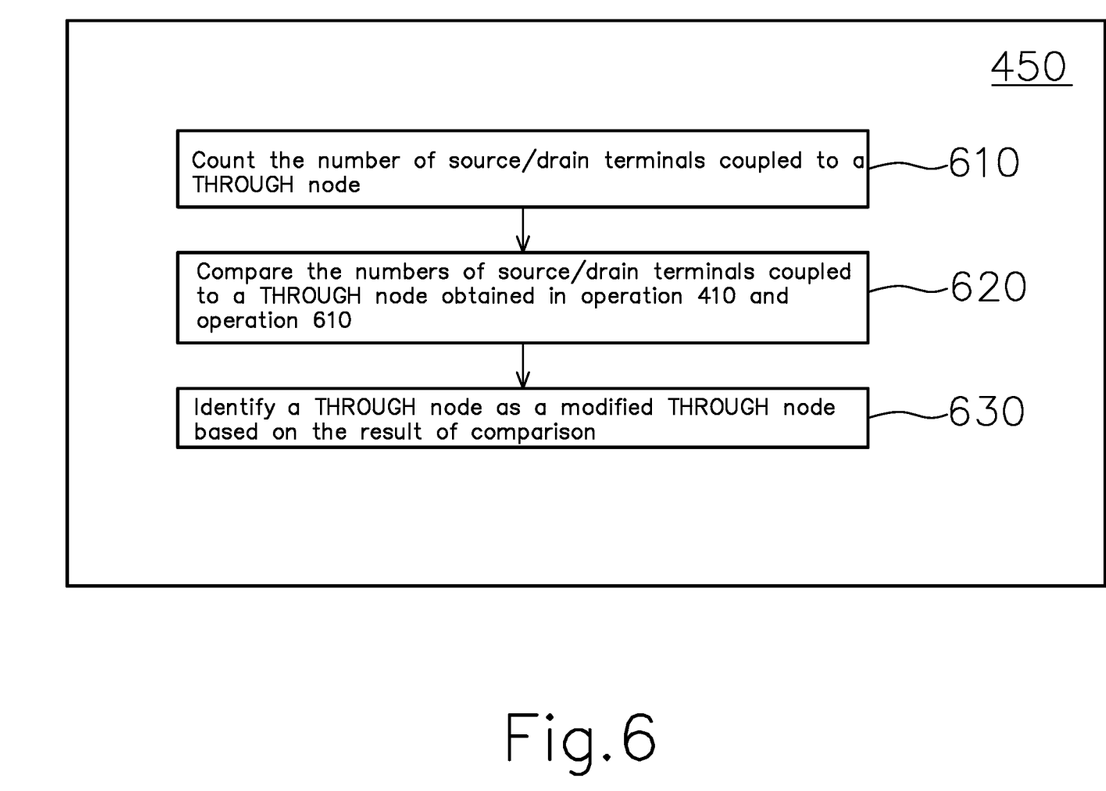
FIG. 6 is a flow chart of an operation of FIG. 4 according to some embodiments.

Referring back to FIG. 4, in operation 450, the identifier 240 of the net-identifying module 210 identifies a modified THROUGH node of the circuit unit 500. FIG. 6 is a flow chart of operation 450 of FIG. 4 according to some embodiments. In operation 610, the identifier 240 of the net-identifying module 210 counts the number of the source/drain terminals of the circuit unit 500 connected to a THROUGH node of the circuit unit 500. As illustrated in FIG. 5, the THROUGH node (TH1) is connected to the first source/drain terminals of the transistors (M1, M2, M3). The THROUGH nodes (TH2, TH4) are connected to the second source/drain terminals of the transistors (M3, M7, M48). The THROUGH node (TH3) is connected to the first source/drain terminal of the transistors (M5, M6, M7). As such, the numbers of source/drain terminals of the circuit unit 500 connected to the THROUGH nodes (TH1, TH2, TH3, TH4) of the circuit unit 500 obtained by the identifier 240 of the net-identifying module 210 are three, three, three, and three, respectively.

Referring back to FIG. 6, in operation 620, the identifier 240 of the net-identifying module 210 compares the numbers of source/drain terminals connected to a THROUGH node obtained thereby in operations 410, 610. In operation 630, the identifier 240 of the net-identifying module 210 identifies a THROUGH node as a modified THROUGH node of the circuit unit 500 based on the result of comparison in operation 620. In this exemplary embodiment, when the result of comparison indicates that the numbers of source/drain terminals connected to a THROUGH node obtained by the identifier 240 in operations 410, 610 are not the same, the THROUGH node is identified by the identifier 240 as a modified THROUGH node.

As described above, the number of source/drain terminals, i.e., three, connected to the THROUGH node (TH1) of the circuit unit 300 obtained in operation 410 is the same as the number of the source/drain terminals connected to the THROUGH node (TH1) of the circuit unit 500 obtained in operation 610. The number of source/drain terminals, i.e., three, connected to the THROUGH node (TH3) of the circuit unit 300 obtained in operation 410 is also the same as the number of the source/drain terminals connected to the THROUGH node (TH3) of the circuit unit 500 obtained in operation 610. The number of source/drain terminals, i.e., four, connected to the THROUGH node (TH2) of the circuit unit 300 obtained in operation 410 is different from the number of source/drain terminals, i.e., three, connected to the THROUGH node (TH2) of the circuit unit 500 obtained in operation 610. The number of source/drain terminals, i.e., four, connected to the THROUGH node (TH4) of the circuit unit 300 obtained in operation 410 is also different from the number of source/drain terminals, i.e., three, connected to the THROUGH node (TH4) of the circuit unit 500 obtained in operation 610. As such, the identifier 240 of the net-identifying module 210 identifies the THROUGH nodes (TH2, TH4) as modified THROUGH nodes of the circuit unit 500.

Referring back to FIG. 4, in operation 460, the identifier 240 of the net-identifying module 210 identifies a component of the circuit unit 300 that interconnects the modified THROUGH nodes, i.e., the THROUGH nodes (TH2, TH4), as the false-path net of the circuit unit 300. As illustrated in FIG. 3, a component (N) of the circuit unit 300 interconnects the THROUGH nodes (TH2, TH4) of the circuit unit 300. As such, the identifier 240 of the net-identifying module 210 identifies the component (N) as the false-path net of the circuit unit 300.

Next, in operation 130, the output provider 250 of the net-identifying module 210 provides a net information output that includes information associated with the false-path net identified in operation 120. In this exemplary embodiment, the information associated with the false-path net include the THROUGH nodes (TH2, TH4) of the circuit unit 300.

In operation 140, the false path-eliminating module 220 eliminates a false path in the second electronic list received in operation 110 based on the net information output provided in operation 130.

Figure 7:
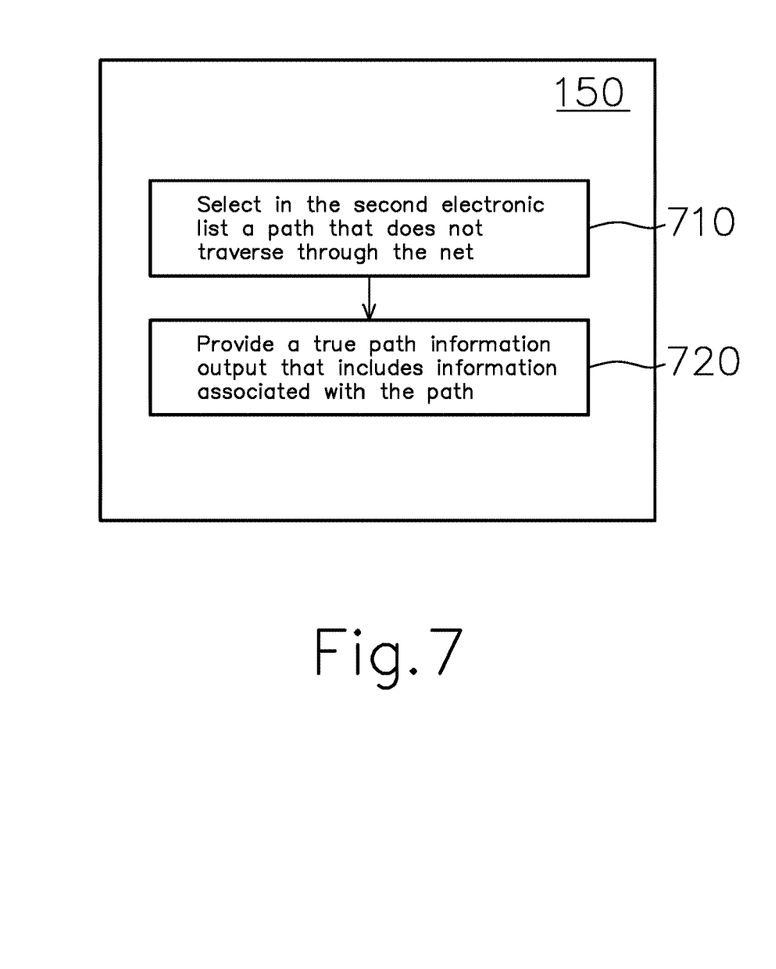
FIG. 7 is a flow chart of an operation of FIG. 1 according to some embodiments.

FIG. 7 is a flow chart of operation 140 of FIG. 1 according to some embodiments. In operation 710, the false path-eliminating module 220 selects in the second electronic list received in operation 110 a path that does not traverse through the false-path net in the net information output provided in operation 130. As illustrated in FIG. 3, the paths (P1, P2) do not traverse through the false-path net (N), whereas the paths (P3, P4) traverse through the false-path net (N). As such, the false path-eliminating module 220 selects the paths (P1, P2) in the second electronic list.

Referring back to FIG. 7, in operation 720, the false path-eliminating module 220 provides a true path information output that includes information associated with the paths (P1, P2), i.e., the true paths, selected thereby in operation 710. This eliminates the paths (P3, P4), i.e., the false paths, in the second electronic list, whereby circuit analysis may be performed only on the true paths (P1, P2) of the circuit unit 300 in the true path information output.

Figure 8:
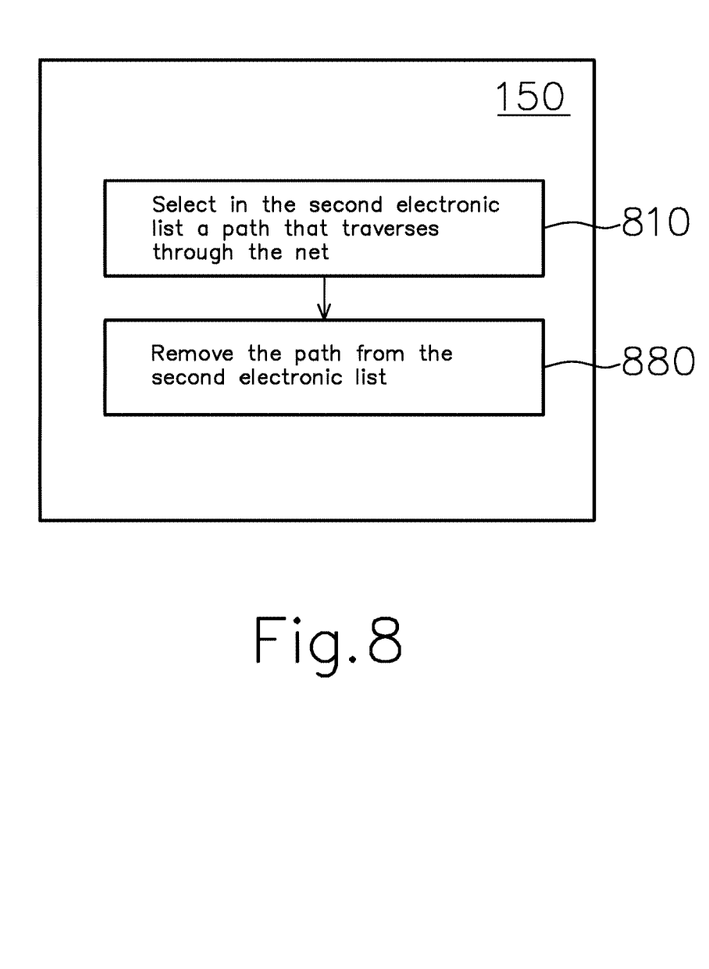
FIG. 8 is a flow chart of an operation of FIG. 1 according to some embodiments.

FIG. 8 is another flow chart of operation 140 of FIG. 1 according to some embodiments. In operation 810, the false path-eliminating module 220 selects in the second electronic list received in operation 110 a path that traverses through the false-path net in the net information output provided in operation 130. As illustrated in FIG. 3, the paths (P1, P2) do not traverse through the false-path net (N), whereas the paths (P3, P4) traverse through the false-path net (N). As such, the false path-eliminating module 220 selects the paths (P3, P4) in the second electronic list.

Referring back to FIG. 8, in operation 820, the false path-eliminating module 220 removes the paths (P3, P4), i.e., the false paths, selected thereby in operation 810 from the second electronic list. This eliminates the false paths (P3, P4) in the second electronic list, whereby circuit analysis may be performed on the true paths (P1, P2) of the circuit unit 300 in the second electronic list.

Figure 9:
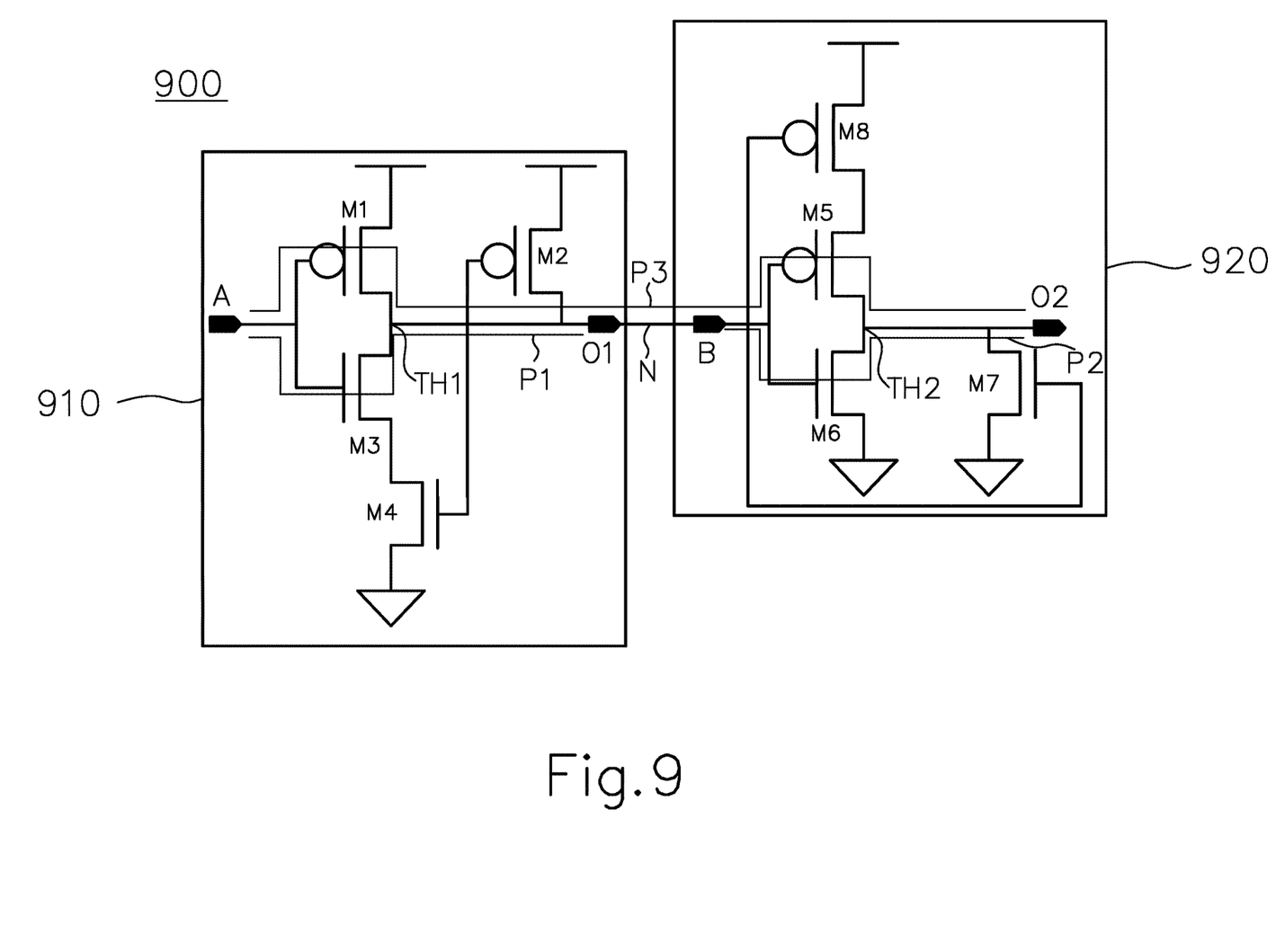
FIG. 9 is a schematic diagram of an exemplary circuit unit according to some embodiments.

FIG. 9 is a schematic circuit diagram of a circuit unit 900 according to some embodiments. The circuit unit 900 includes CCG circuits 910, 920, FROM nodes (A, B), TO nodes (O1, O2), and THROUGH nodes (TH1, TH2), and a net (N) that interconnects the FROM and TO nodes (B, O1). In this exemplary embodiment, the CCG circuit 910 is a NAND gate, whereas the CCG circuit 920 is a NOR gate. As illustrated in FIG. 9, the NAND gate 910 includes transistors (M1, M2, M3, M4), each of which has first and second source/drain terminals and a gate terminal. Similarly, the NOR gate 920 includes transistors (M5, M6, M7, M8), each of which has first and second source/drain terminals and a gate terminal.

An exemplary method for eliminating a false path of the circuit unit 900 with the use of the system 200 according to some embodiments will now be described with further reference to FIG. 1. In operation 110, the input receiver 230 of the net-identifying module 210 receives first and second electronic lists. In this exemplary embodiment, the first electronic list, such as a net list, contains information associated with connections among the transistors (M1, M2, M3, M4, M5, M6, M7, M8) of the circuit unit 900. Such information, as illustrated in FIG. 9, include: the first source/drain terminals of the transistors (M1, M2, M3) connected to the THROUGH node (TH1) and the TO node (O1); the first source/drain terminals of the transistors (M5, M6, M7) connected to the THROUGH node (TH2) and the TO node (O2); the gate terminals of the transistors (M1, M3) connected to the FROM node (A); and the gate terminals of the transistors (M5, M6) connected to the FROM node (B).

In this exemplary embodiment, the second electronic list contains information associated with paths of the circuit unit 900. The information associated with paths of the circuit unit 900, as illustrated in FIG. 9, include: a path (P1) that traverses from the FROM node (A) to the TO node (O1) through the THROUGH node (TH1); a path (P2) that traverses from the FROM node (B) to the TO node (O2) through the THROUGH node (TH2); and a path (P3) that traverses from the FROM node (A) to the TO node (O2) through the THROUGH nodes (TH1, TH2).

Next, in operation 120, the identifier 240 of the net-identifying module 210 identifies a false-path net of the circuit unit 300 based on the first electronic list.

Referring to FIG. 4, in operation 410, the identifier 240 of the net-identifying module 210 counts the number of source/drain terminals of the circuit unit 900 connected to a THROUGH node of the circuit unit 900. As illustrated in FIG. 9, the THROUGH node (TH1) is connected to the first source/drain terminals of the transistor (M1, M2, M3). The THROUGH node (TH2) is connected to the first source/drain terminals of the transistors (M5, M6, M7). As such, the numbers of source/drain terminals of the circuit unit 900 connected to the THROUGH nodes (TH1, TH2) of the circuit unit 900 obtained by the identifier 240 of the net-identifying module 210 are three and three, respectively.

Referring back to FIG. 4, in operation 420, the identifier 240 of the net-identifying module 210 determines whether the circuit unit 900 includes transistors connected in parallel. If it is determined that the circuit unit 900 includes parallel transistors, the flow proceeds to operation 430. Otherwise, i.e., the identifier 240 of the net-identifying module 210 determines that the circuit unit 900 does not include parallel transistors, the flow proceeds to operation 440.

In this exemplary embodiment, operation 420 includes identifying which of the transistors of the circuit unit 900 are connected in parallel. As illustrated in FIG. 9, none of the transistors (M1, M2, M3, M4, M5, M6, M7, M8) of the circuit 900 are connected in parallel. As such, the identifier 240 of the net-identifying module 210 determines that the circuit unit 900 does not include parallel transistors. Therefore, the flow proceeds to operation 440.

Referring back to FIG. 4, in operation 440, the identifier 240 of the net-identifying module 210 determines whether the circuit unit 500 includes an unbalanced FROM node. In this exemplary embodiment, the unbalanced FROM node is a FROM node of the circuit unit 900 that has p-type transistors connected thereto the number of which is different from the number of n-type transistors connected thereto. In some embodiments, operation 440 includes (a) counting the numbers of p-type and n-type transistors of the circuit unit 900 connected to a FROM node of the circuit unit 900 and (b) comparing the number of p-type transistors with the number of n-type transistors obtained in (a).

If it is determined that the circuit unit 900 includes such an unbalanced FROM node, the flow proceed to operation 450. Otherwise, the flow is terminated. As illustrated in FIG. 9, the FROM node (A) has the same number of p-type and n-type transistors connected thereto, i.e., one p-type transistor (M1) and one n-type transistor (M3). The FROM node (B) also has the same number of p-type and n-type transistors connected thereto, i.e., one p-type transistor (M5) and one n-type transistor (M6). As such, the identifier 240 of the net-identifying module 210 determines that the circuit unit 300 does not include an unbalanced FROM node. Therefore, the flow is terminated. This indicates that the paths of the circuit unit 900 in the second electronic list are true paths, i.e., none of the paths in the second electronic list is a false path, and that the net (N) is a true-path net, i.e., a net through which a true path, not a false path, of a circuit unit traverses, e.g., the true path (P3).

In an exemplary embodiment, a method comprises receiving first and second electronic lists associated with a circuit unit, identifying a net of the circuit unit based on the first electronic list, providing a net information output that includes information associated with the net, selecting in the second electronic list a path of the circuit unit that does not traverse through the net, and providing a path information output that includes information associated with the path.

In another exemplary embodiment, a system comprises a net-identifying module and a false path-eliminating module. The net-identifying module is configured to receive first and second electronic lists associated with a circuit unit, to identify a net of the circuit unit based on the first electronic list, and to provide a net information output that includes information associated with the net. The false path-eliminating module is coupled to the net-identifying module and is configured to eliminate a false path of the circuit unit in the second electronic list based on the net information output.

In another exemplary embodiment, a method comprises receiving first and second electronic lists associated with a circuit unit, identifying a net of the circuit unit based on the first electronic list, providing a net information output that includes information associated with the net, selecting in the second electronic list a path of the circuit that traverses through the net, and removing the path from the second electronic list.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a net-identifying module configured to receive first and second electronic lists associated with a circuit unit, to identify a net of the circuit unit based on the first electronic list, and to provide a net information output that includes information associated with the net; and
a false path-eliminating module coupled to the net-identifying module and configured to select, in the second electronic list, a path of the circuit unit that does not traverse through the net and provide a path information output that includes information associated with the path.

2. The system of claim 1, wherein the net-identifying module is further configured to count the number of source/drain terminals of the circuit unit coupled to a first node of the circuit unit.

3. The system of claim 1, wherein the net-identifying module is further configured to replace parallel transistors of the circuit unit with a single transistor.

4. The system of claim 3, wherein the net-identifying module is further configured to compare the numbers of source/drain terminals of the circuit unit connected to a first node of the circuit unit prior to and after replacing the parallel transistors with the single transistor.

5. The system of claim 4, wherein the net-identifying module is further configured to identify a component of the circuit unit coupled to the first node as the net based on the result of comparison.

6. The system of claim 1, wherein the net-identifying module is further configured to determine whether the circuit unit includes a second node that has different numbers of p-type and n-type transistors of the circuit unit coupled thereto.

7. The system of claim 1, wherein the false path-eliminating module is further configured to select in the second electronic list a path of the circuit unit that does not traverse through the net and to provide a path information output that includes information associated with the path.

8. The system of claim 1, wherein the false path-eliminating module is further configured to select in the second electronic list a path of the circuit unit that traverses through the net and to remove the path from the second electronic list.

9. A method comprising:
receiving, by a net-identifying module, first and second electronic lists associated with a circuit unit;
identifying, by the net-identifying module, a net of the circuit unit based on the first electronic list;
providing, by the net-identifying module, a net information output that includes information associated with a net;
selecting, by a false path-eliminating module, in the second electronic list a path of the circuit unit that does not traverse through the net; and
providing, by the false path-eliminating module, a path information output that includes information associated with the path.

10. The method of claim 9, further comprising counting, by the net-identifying module, the number of source/drain terminals of the circuit unit coupled to a first node of the circuit unit.

11. The method of claim 9, further comprising replacing, by the net-identifying module, parallel transistors of the circuit unit with a single transistor.

12. The method of claim 11, further comprising comparing, by the net-identifying module, the numbers of source/drain terminals of the circuit unit coupled to a first node of the circuit unit prior to and after replacing the parallel transistors with the single transistor.

13. The method of claim 12, further comprising, by the net-identifying module, identifying a component of the circuit unit coupled to the first node as the net based on the result of comparison.

14. The method of claim 9, further comprising determining, by the net-identifying module, whether the circuit unit includes a second node that has different numbers of p-type and n-type transistors of the circuit unit coupled thereto.

15. The method of claim 9, further comprising selecting, by the false path-eliminating module, in the second electronic list a path of the circuit unit that does not traverse through the net and to provide a path information output that includes information associated with the path.

16. The method of claim 9, further comprising selecting, by the false path-eliminating module, in the second electronic list a path of the circuit unit that traverses through the net and to remove the path from the second electronic list.

17. A method comprising:
receiving, by a net-identifying module, a plurality of electronic lists associated with a circuit unit;
identifying, by the net-identifying module, a net of the circuit unit based on one of the plurality of electronic lists;
providing, by the net-identifying module, a net information output that includes information associated with a net;

selecting, by a false path-eliminating module, in another one of the plurality of electronic lists a path of the circuit unit that does not traverse through the net; and providing, by the false path-eliminating module, a path information output that includes information associated with the path.

18. The method of claim 17, further comprising counting, by the net-identifying module, the number of source/drain terminals of the circuit unit coupled to a first node of the circuit unit.

19. The method of claim 17, further comprising replacing, by the net-identifying module, parallel transistors of the circuit unit with a single transistor.

20. The method of claim 19, further comprising comparing, by the net-identifying module, the numbers of source/drain terminals of the circuit unit coupled to a first node of the circuit unit prior to and after replacing the parallel transistors with the single transistor.

* * * * *